United States Patent [19]
Schade, Jr.

[11] Patent Number: 4,864,379
[45] Date of Patent: Sep. 5, 1989

[54] BIPOLAR TRANSISTOR WITH FIELD SHIELDS

[75] Inventor: Otto H. Schade, Jr., N. Caldwell, N.J.

[73] Assignee: General Electric Company, Fairfield, Conn.

[21] Appl. No.: 197,098

[22] Filed: May 20, 1988

[51] Int. Cl.$^4$ .............................................. H01L 29/72
[52] U.S. Cl. ........................................ 357/35; 357/53; 357/34; 357/59; 357/36; 357/51
[58] Field of Search ................... 357/53, 51, 34, 59 F, 357/59 H, 59 J, 35, 36, 91

[56] References Cited

U.S. PATENT DOCUMENTS

| | | | |
|---|---|---|---|
| 3,911,473 | 10/1975 | Nienhuis | 357/53 X |
| 4,298,402 | 11/1981 | Hingarh | 357/91 X |
| 4,423,433 | 12/1983 | Imaizumi et al. | 357/53 X |
| 4,430,663 | 2/1984 | D'Altroy et al. | 357/53 |
| 4,437,107 | 3/1984 | Jonsson et al. | 357/53 X |
| 4,656,496 | 4/1987 | Widlar | 357/59 F |

*Primary Examiner*—William A. Mintel
*Attorney, Agent, or Firm*—K. R. Glick; W. J. Shanley

[57] ABSTRACT

A bipolar transistor includes a substrate of semiconductor material having an expitaxial body of the semiconductor material on a surface thereof. The semiconductor body has a major surface. A collector region of one conductivity type is in the body at the major surface and a base region of the opposite conductivity type is in the collector region at the major surface and forms with the collector region a collector/base junction which extends to the surface. A plurality of emitter regions of the one conductivity type are in the base region and form with the base region emitter/base junctions which extend to the surface. At least some of the emitter/base junctions are adjacent to but spaced from the collector/base junction at the major surface. A layer of insulating silicon oxide is on the major surface and a layer of conductive polysilicon is on the insulating layer. The polysilicon layer includes strips which extend only over the area of the surface between the collector/base junction and the adjacent emitter/base junctions and resistor areas to which the strips are connected. The emitter regions are connected to the polysilicon layer. The bipolar transistor may be part of an integrated circuit which includes MOS transistors and the polysilicon layer also forms the gates of the MOS transistors.

11 Claims, 2 Drawing Sheets

BIPOLAR TRANSISTOR WITH FIELD SHIELDS

FIELD OF THE INVENTION

The present invention relates to a bipolar transistor, and, more particularly, to a bipolar transistor which is ballasted and shielded by a layer of conductive polycrystalline silicon, polysilicon.

BACKGROUND OF THE INVENTION

In the field of MOS transistor integrated circuits, it has become the practice to form the gates of the transistors of polysilicon which is doped to make it conductive. Also, the polysilicon gates are generally used to mask the channel region of the transistors while forming the source and drain regions on opposite sides of the gates so that the source and drain regions are aligned with their respective gate. Recently, there has been developed integrated circuits which include both MOS transistors and bipolar devices so that the circuits can perform both analog and digital functions. In such circuits, since a layer of doped polysilicon is being provided for making the MOS transistors, it would be desirable to be able to use the polysilicon layer to perform additional functions, particularly in the bipolar devices.

SUMMARY OF THE INVENTION

A bipolar transistor includes a body of a semiconductor material having a major surface. A first region of one conductivity type is in the body and at the major surface. A second region of the opposite conductivity type is in the first region and at the major surface. A third region of the one conductivity type is in the second region with the junction between the second and third regions at the body surface being spaced from the junction between the first and second regions at the body surface. A layer of conductive polycrystalline silicon is over and insulated from the major surface of the body and extends over the area of the surface between the junctions.

DETAILED DESCRIPTION OF PREFERRED EMBODIMENT

Figure 1:
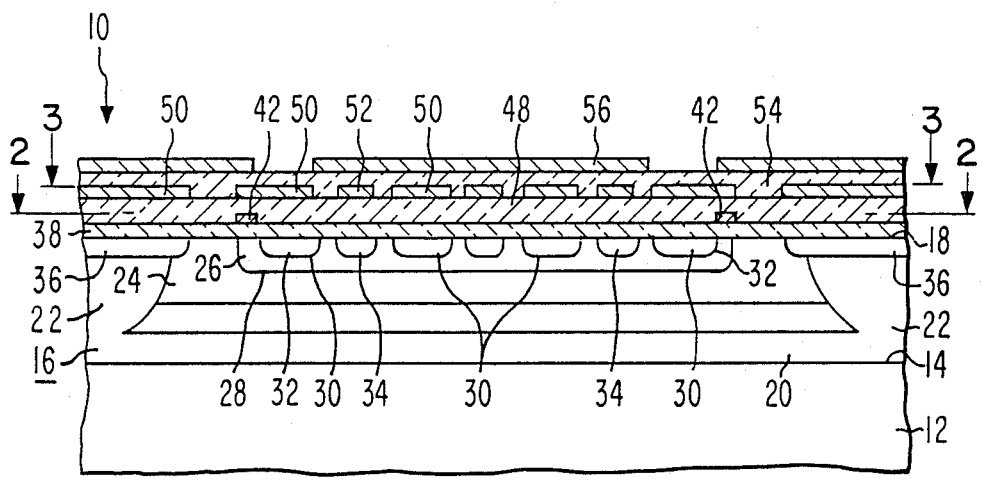
FIG. 1 is a sectional view of a form of a bipolar transistor incorporating the present invention.

Referring initially to FIG. 1, a bipolar transistor, generally designated as 10, is formed on a substrate 12 of a semiconductor material, such as single crystalline silicon, of one conductivity type, such as P-type. The substrate 12 may have formed therein or thereon other components, such as MOS transistors and other bipolar devices, which form a desired electrical circuit. On the surface 14 of the substrate 12 is a body 16 of the semiconductor material of the opposite conductivity type, such as N-type, having a major surface 18. The body 16 may be a layer of the semiconductor material which was e-pitaxially deposited on the substrate surface 14. The body 16 includes a thin region 20 along the substrate surface 14 which is highly conductive, i.e. an N+type region, and highly conductive, N++type, contact regions 22 extending through the body 16 to the highly conductive region 20. This forms a well region 24 of N-type conductivity in the body 16 which is the collector of the bipolar transistor 10.

Figure 2:
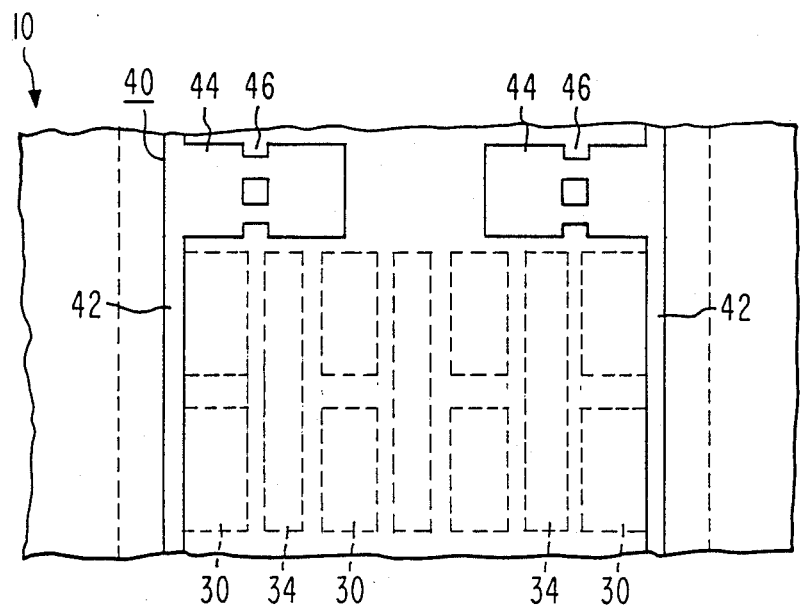
FIG. 2 is a sectional view taken along line 2—2 of FIG. 1.

Within the well region 24 and at the surface 18 is a region 26 of the one conductivity type, i.e. P-type, which forms the base of the bipolar transistor 10 with the junction 28 between the well region 24 and the base region 26 extending to the surface 18. Within the base region 26 and at the surface 18 are a plurality of regions 30 of the opposite conductivity type, i.e. N-type, which form the emitters of the bipolar transistor 10. As shown in FIG. 2, the emitter regions 30 are arranged in rows and columns. Each of the emitter regions 30 forms a junction 32 with the base region 26 which extends to the surface 18. The emitter/base junctions 32 of the emitter regions 30 which are adjacent the base/collector junction 28 are spaced from the base/collector junction 28. Also within the base region 26 at the surface 18 and between the columns of the emitter regions 30 are highly conductive regions 34 of the one conductivity type, i.e. P+ type, which serve as contacts to the base region 26. At the surface 18 and over the contact region 22 is a highly conductive collector contact region 36 of the opposite conductivity type, i.e. N+ type.

On the body surface 18 is a layer 38 of an insulating material, such as silicon oxide. On the silicon oxide layer 38 is a layer 40 of conductive polysilicon. As shown in FIGS. 1 AND 2, the polysilicon layer 40 includes a pair of narrow strips 42 which extend over and along the area of the surface 18 between the collector/base junction 28 and the emitter/base junctions 32 of the emitter regions 26 which are adjacent the collector/base junction 28. As will be explained, in forming the bipolar transistor 10, the polysilicon strips 42 are used as masks to define the space between the collector/base junction 28 and the adjacent emitter/base junctions 32 and thereby define an electrical characteristic of the transistor 10. In addition, the polysilicon strips 40 serve as an emitter/base field shield. Each of the polysilicon strips 40 extends to one end of a substantially rectangular area 44 of the polysilicon which is at one end of the emitter regions 30. The polysilicon areas 44 serve as emitter ballast resistors and have openings 46 therethrough which define the resistance of the resistors.

Figure 3:
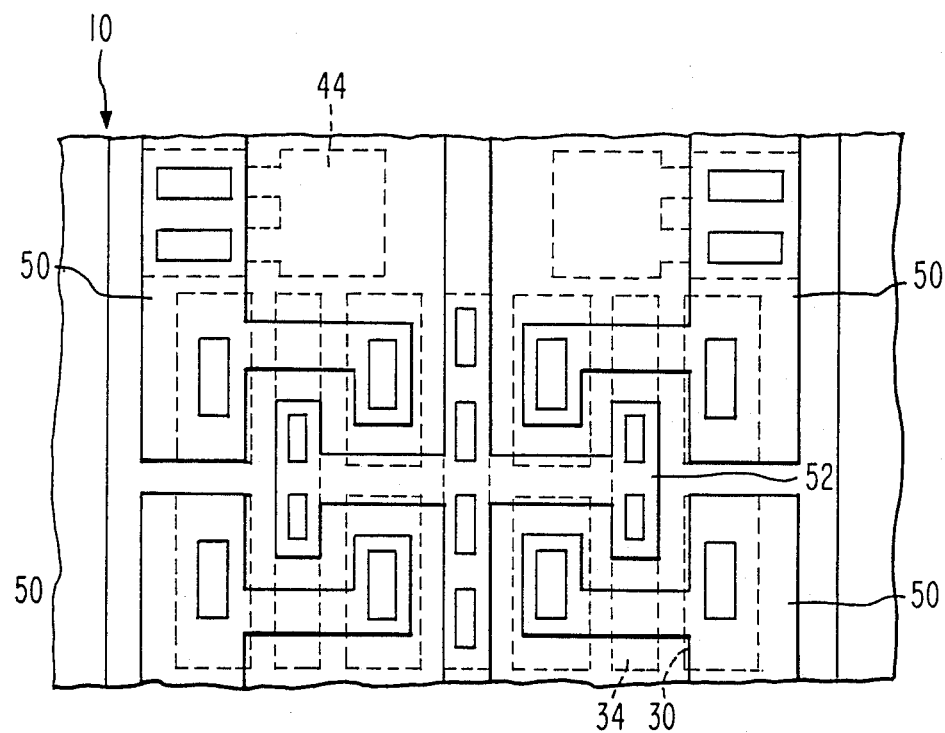
FIG. 3 is a sectional view taken along line 3—3 of FIG. 1.

A layer 48 of an insulating material, such as silicon oxide, is over the polysilicon layer 40 and the uncovered portions of the silicon oxide layer 38. A first level metalization is on the silicon oxide layer 48. The first level metalization will usually be a layer of a conductive metal, such as aluminum, but may be a layer of doped polysilicon. The conductive layer is defined to form conductors extending between the various portions of the transistor 10. As shown in FIG. 3, the first level metalization includes emitter conductors 50 which extend between the emitter regions 30 and through openings in the silicon oxide layers 48 and 38 to make ohmic contact to the emitter regions 30. The emitter conductors 50 also extend over one end of the resistors 44 and extend through openings in the silicon oxide layer 48 to make ohmic contact to the resistors 44. Thus, the emitter regions 30 are electrically connected to the resistors 44. Base conductors 52 extend between the base contact regions 34 and through openings in the silicon oxide layers 48 and 38 to make ohmic contact to the base contact regions 34. The conductors 50 and 52 extend to separate terminal pads, not shown, at the edges of the transistor 10 where conductors from other components in the circuit can be connected to the emitter and base of the transistor 10.

A layer 54 of an insulating material, such as silicon oxide, is over the first level metalization and any uncovered area of the silicon oxide layer 48. A second level metalization is on the silicon oxide layer 54. The second level metalization is also usually a layer of a conductive metal, such as aluminum, but may be a layer of doped polysilicon which is defined to form conductors. The second level metalization is formed into collector conductors 56 which extend through openings in the silicon oxide layers 54, 48 and 38 to make ohmic contact to the collector contact regions 36. The second level metalization also includes conductors, not shown, which extend through openings in the silicon oxide layers 54 and 48 to make ohmic contact to the other ends of the resistors 44.

In making the bipolar transistor 10, after the collector region 24 and its contact regions 20 and 22 are formed in the body 16, and the base region 26 is formed in the collector region 24, such as by diffusion or ion implantation, the silicon oxide insulating layer 38 is formed on the body surface 18. A layer of doped polysilicon is then deposited on the silicon oxide layer 38 and defined to form the strips 42 and resistors 44. If the bipolar transistor 10 is being made as part of an integrated circuit which also includes MOS transistors, the polysilicon layer is also defined to form the gates of the MOS transistors. The emitter regions 30 are then formed in the base region 26 such as by diffusion or ion implantation using the strips 42 as a mask to define the spacing between the collector/base junction 28 and the emitter/base junctions 32 which are adjacent the collector base junction 28 at the surface 18. Since this spacing determines certain electrical characteristics of the bipolar transistor 10, by using the strips 42 to define this spacing, the spacing can be easily and accurately controlled to provide the desired characteristics for the bipolar transistor 10.

Thus, there is provided by the present invention a bipolar transistor 10 having a layer of conductive polysilicon, a portion of which serves as a mask to define the spacing between the collector/base junction and the emitter/base junction so as to define certain electrical characteristics of the bipolar transistor 10. In addition, if the bipolar transistor 10 is part of an integrated circuit containing MOS transistors, the same conductive polysilicon layer can be used to form the gates of the MOS transistors. Also, the same portions of the doped polysilicon layer which serve as the masking shield also serve as an emitter/base field shield which is connected to the emitters 30 through the emitter conductors 50 which contact the polysilicon layer at the resistors 44 so as to be at the emitter potential. Furthermore, the doped polysilicon layer includes resistor regions 44 which are connected to the emitters 30 to serve as ballast resistors for the bipolar transistor 10. Thus, the doped polysilicon layer 40 serves a number of different functions in the bipolar transistor 10 both in the making of the transistor and its operation. Although the bipolar transistor 10 has been described as having N-type conductivity collector and emitter regions and a P-type conductivity base region to form an NPN transistor, the conductivity type of the regions can be reversed to form a PNP transistor.

I claim:

1. A bipolar transistor comprising:
    a body of a semiconductor material having a major surface;
    a first region of one conductivity type in said body and at said surface;
    a second region of the opposite conductivity type in said first region at said surface;
    a third region of the one conductivity type in said second region with a junction between the third region and the second region being spaced from a junction between the second region and the first region; and
    a layer of conductive polycrystalline silicon over and insulated from said surface of the body and having strip portions extending only over the entire area of the surface between said junctions to serve as a field shield.

2. A bipolar transistor in accordance with claim 1 wherein the layer of conductive polycrystalline silicon includes an area forming a resistor.

3. A bipolar transistor in accordance with claim 2 including a layer of insulating silicon oxide over the major surface of the body and the polycrystalline silicon layer is on the insulating layer.

4. A bipolar transistor in accordance with claim 3 including a plurality of spaced third regions in said second region forming the emitter of said transistor with some of said third regions having their junctions with the second region being adjacent to but spaced from the junction between the second and first regions, and the strips of the polycrystalline silicon extend over the area of said major surface between said junctions.

5. A bipolar transistor in accordance with claim 4 in which the third regions are arranged in rows and columns.

6. A bipolar transistor in accordance with claim 5 including contact regions of the same conductivity type as the second region but more highly conductive than the second region, said contact regions being in the second region between the columns of the third regions.

7. A bipolar transistor in accordance with claim 6 in which the resistor areas are substantially rectangular areas of the polycrystalline silicon layer with the strips being connected to an end of the resistor areas.

8. A bipolar transistor in accordance with claim 7 in which the resistor areas, include notches in opposite edges thereof to adjust the resistance of the resistors.

9. A bipolar transistor in accordance with claim 8 including a layer of insulating silicon oxide over the polycrystalline silicon layer and conductors over the silicon oxide layer, said conductors extending through openings in the silicon oxide layers with some of the conductors making ohmic contact to the third regions and some of the conductors making ohmic contact to the contact regions of the second region.

10. A bipolar transistor in accordance with claim 9 in which the contacts which make ohmic contact to the third region also make ohmic contact to the resistor areas.

11. A bipolar transistor comprising:
    a substrate of single crystalline silicon;
    an epitaxial body of single crystalline silicon on said substrate and having a major surface;
    a collector region of one conductivity type in said body at said major surface;
    a base region of the opposite conductivity type in the collector region at said major surface and forming with the collector region a collector/base junction which extends to said major surface;
    a plurality of emitter regions of the one conductivity type in said base region at said major surface, each of said emitter regions forming with the base region emitter/base junctions which extend to said major surface with some of the emitter/base junctions being adjacent to but spaced from the collector/base junction at the major surface;

a layer of insulating silicon oxide on said major surface;

a layer of conductive polycrystalline silicon on said insulating layer, said polycrystalline silicon layer having strips which extend over only the entire area of the major surface between the collector/base junction and the adjacent emitter/base junctions and having resistor areas to which the strips are connected; and means connecting the polycrystalline silicon layer to the emitters.

* * * * *